United States Patent [19]
Bergemont

[11] Patent Number: 5,828,102
[45] Date of Patent: Oct. 27, 1998

[54] MULTIPLE FINGER POLYSILICON GATE STRUCTURE AND METHOD OF MAKING

[75] Inventor: Albert Bergemont, Palo Alto, Calif.

[73] Assignee: National Semiconductor Corporation, Santa Clara, Calif.

[21] Appl. No.: 940,556

[22] Filed: Sep. 30, 1997

Related U.S. Application Data

[63] Continuation of Ser. No. 703,547, Aug. 27, 1996, abandoned.

[51] Int. Cl.$^6$ .................................................. H01L 29/768
[52] U.S. Cl. .......................... 257/342; 257/341; 257/401; 438/283; 438/587; 438/598
[58] Field of Search ..................................... 257/382, 384, 257/412, 369, 390, 401, 407, 653, 654, 341, 342; 438/157, 279, 283, 587, 598

[56] References Cited

U.S. PATENT DOCUMENTS

| | | | |
|---|---|---|---|
| 4,808,861 | 2/1989 | Ehni ......................................... | 327/389 |
| 4,866,567 | 9/1989 | Crafts et al. ............................. | 361/311 |
| 4,920,393 | 4/1990 | Kawakami ............................... | 257/401 |
| 4,949,139 | 8/1990 | Korsh et al. ............................. | 327/391 |
| 5,079,670 | 1/1992 | Tigelaar et al. .......................... | 257/315 |
| 5,321,292 | 6/1994 | Gongwer .................................. | 257/367 |

OTHER PUBLICATIONS

S.P. Voinigescu et al., "An Assessment of the State–of–the–Art 0.5 μm Bulk CMOS Technology for RF Applications", IEDM 95, pp. 721–724, 1995.

H. Nakamura et al., "A Novel Sense Amplifier for Flexible Voltage Operation NAND Flash Memories", 1995 Symposium on VLSI Circuits Digest of Technical Papers, pp. 71–72.

T. Tanzawa et al., "A Stable Programming Pulse Generator for High–Speed Programming Single Power Supply Voltage Flash Memories", 1995 Symposium on VLSI Circuits Digest of Technical Papers, pp. 73–74.

*Primary Examiner*—Valencia Wallace
*Assistant Examiner*—George C. Eckert, II
*Attorney, Agent, or Firm*—Limbach & Limbach LLP

[57] ABSTRACT

Disclosed is a MOS transistor having a polysilicon gate structure in which an overlying metal interconnect completely shorts the gate area. In one embodiment, the gate is formed from multiple fingers joined in a serpentine pattern and separated by oxide-filled spaces. Overlying the fingers and oxide-filled spaces is an interconnect comprising a first metal layer and a second metal layer. The first metal layer overlies the fingers and oxide-filled spaces and the second metal layer overlies the first metal layer. Both metal layers form a stack that simultaneously shorts the fingers. Also disclosed is a method of fabricating such a polysilicon gate structure in a MOS transistor using a series of masks. Once the gate and fingers are defined, a conformal oxide is deposited over the fingers and in the spaces between the fingers. The conformal oxide is anisotropically etched to produce a planarized profile of the fingers and oxide-filled spaces. A metal interconnect is formed from a first metal layer and an overlying second metal layer by which all of the fingers are shorted simultaneously.

8 Claims, 6 Drawing Sheets

MULTIPLE FINGER POLYSILICON GATE STRUCTURE AND METHOD OF MAKING

This is a continuation of application Ser. No. 08/703,547 filed on Aug. 27, 1996, now abandoned.

BACKGROUND OF THE INVENTION

1. Field of the Invention

The present invention relates to MOS transistors and methods for fabricating the transistors. More particularly, the invention relates to MOS transistors having multiple finger gate structures and capable of operating at high frequencies.

2. Description of the Related Art

High frequency wireless MOS technology for gate lengths below $0.5\mu$ is an emerging technology. Devices having gate lengths of $0.3\mu$ and $0.1\mu$ with intrinsic cut-off frequencies $f_t$ as high as 10 GHz and 60 GHz, respectively, have been reported in the literature.

Two device characteristics are particularly important for high frequency wireless MOS transistors. The intrinsic cut off frequency, $f_t$, can be represented as:

$$f_t = g_m / [2\pi(C_{gs} + C_{gd})],$$

where $g_m$=transconductance of the MOS transistor, $C_{gs}$=signal gate-to-source capacitance, $C_{gd}$=signal gate-to-drain capacitance.

Another important variable for high frequency transistors is $f_{max}$, the maximum frequency of oscillation (the frequency at which a device can amplify the power of a signal). Maximum frequency, $f_{max}$, is defined as:

$$f_{max} = f_t/2[2 \pi f_t C_{gd} + g_o(R_g + R_s)]^{1/2},$$

where $g_o$=output conductance, $R_g$=total gate resistance and $R_s$=source resistance.

For a given CMOS technology, based on these relationships, the only way to increase $f_{max}$ is to make the term $[2 \pi f_t C_{gd} + g_o(R_g + R_s)]$ less than 1. From this relationship, it can be seen that reducing $C_{gs}$ and $C_{gd}$ (overlap of drain and source regions under the gate) is desirable. However, conventional MOS technology uses "Light-Doped Drain" (LDD) technology to minimize adverse effects of hot carriers on device reliability, leading to typical values of $C_{gs}+C_{gd}$ in the range of 60 fF for $0.35\mu$–$0.5\mu$ technologies.

Thus, the only option is to minimize the total gate resistance $R_g$. FIG. 1 graphically represents $f_{max}$ calculated as a function of $R_g$. Until $R_g$ is less than 100Ω, $f_{max}$ is smaller than $f_t$, being limited by $R_g$. For a $0.35\mu$ gate with resistivity of 30Ω/sq, a total gate width W of $20\mu$ will lead to $R_g$=1700Ω!

Most FETs used in a CMOS VLSI chip have a straight gate electrode and rectangular source and drain diffused areas on either side of the gate. The source and drain areas are contacted by metal conductors at many locations along the device width. Other FET configurations are known. For example, the literature reports a wide FET in which the gate appears to be in a serpentine pattern and is "driven" only from one end. There is no shorting of the entire gate area.

It is therefore desirable to provide MOS transistors with reduced gate resistance and drain/source-to-gate overlap capacitance.

SUMMARY OF THE INVENTION

The present invention addresses these and other problems by using a new structure having reduced total gate resistance and drain/source-to-gate overlap capacitance, thereby increasing $f_{max}$ and to some extent $f_t$, respectively. Generally, this structure is a transistor having a polysilicon gate that is totally shorted by a metal such as aluminum. As a result, transistors according to the present invention are especially suitable for high frequency wireless MOS technologies where gates lengths are less than $0.5\mu$.

In one embodiment, MOS transistors according to the present invention include a polysilicon gate underlying a metal interconnect. The interconnect is formed from a first metal layer and a second metal layer. The first metal layer is formed over the gate. The second metal layer is formed on the first metal layer. Together, the first and second metal layers form a stack that completely shorts the gate. In a preferred embodiment, the polysilicon gate has several fingers joined in a serpentine pattern and separated by oxide-filled spaces. More preferably, the fingers have a thickness k and the oxide-filled spaces have a width of $\leq 2$ k and are formed from a conformal oxide layer having a thickness of k.

The present invention is also directed to new processes for fabricating MOS transistors having this gate structure.

In one embodiment of the method, a first step defines a polysilicon gate having a plurality of fingers in a serpentine pattern and separated by spaces. Then, a conformal oxide is deposited over the fingers and in the spaces. An anisotropic etch of the conformal oxide follows with endpoint detection on the polysilicon to produce a planarized profile of the fingers and oxide-filled spaces. Next, a first metal layer is formed on the planarized profile and a second metal layer is formed on the first metal layer to form an interconnect that shorts the polysilicon fingers at the same time.

In a preferred embodiment, a series of specially designed masks is used to form features in the desired configuration at each level of the transistor. A first mask is used to define a gate area in an active device area surrounded by field oxide regions on a substrate. A polysilicon layer is patterned and etched through a second mask to form a polysilicon gate of thickness k, having a plurality of fingers joined in a serpentine pattern and separated by spaces of width less than or equal to 2 k.

The second mask defines first, second, third and fourth regions: the first region defining where the fingers are formed from the polysilicon layer, the second region defining where the polysilicon is etched, but field oxide remains, the third region defining where the polysilicon is etched between the fingers to form the spaces, and the fourth region defining where the polysilicon is etched to open contact windows. Oxide is formed along the periphery of the polysilicon in the fourth regions.

A metal layer of refractory metal silicide or doped polysilicon deposited on the fingers and oxide-filled spaces is etched using a third mask so that the first metal layer covers the active device area but does not cover any contact openings. An interlevel dielectric layer is contact mask printed and etched using a fourth mask to expose the first metal layer.

Finally, an aluminum layer is deposited and etched to form an interconnect with the first metal layer and to form source and drain contacts using a fifth mask, the interconnect serving to short the polysilicon fingers at the same time.

BRIEF DESCRIPTION OF THE DRAWINGS

The present invention will be discussed herein with reference to the following Figures in which the same numeral refers to like elements and in which.

DESCRIPTION OF THE PREFERRED EMBODIMENTS

Figure 1:
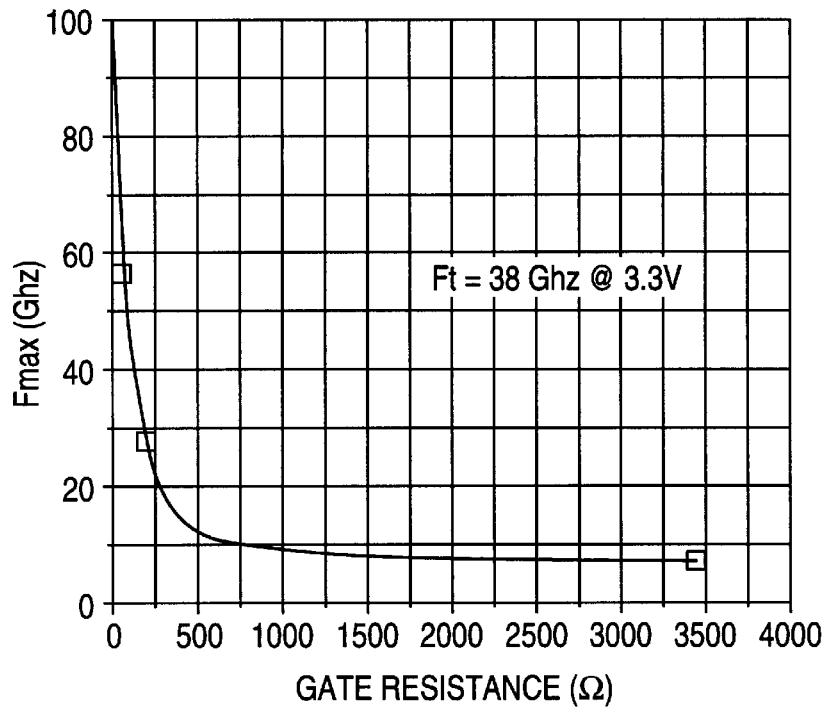
FIG. 1 is a graph showing $f_{max}$ as a function of $R_g$ at constant $f_t$.

MOS transistors 10 according to the present invention are generally described with reference to FIGS. 2, 3 and 4c. As can be seen in these figures, MOS transistors 10 according to the present invention generally include field oxide regions 12 formed on a silicon substrate 14, source and drain regions 16, 18, respectively, implanted in substrate 14, a polysilicon gate 20, and metal layers 24, 26 forming an interconnect that shorts the polysilicon gate. A thin layer of oxide 13 is formed on the substrate underneath the polysilicon gate 20 and its fingers 20a. Layer 26, typically aluminum, and layer 24, typically a doped polysilicon or refractory metal silicide, form a stack that shorts all of the fingers of gate area. A conventional interlevel dielectric 25, typically silicon dioxide, is deposited over metal layer 24 and underlies metal layer 26. Contact windows 30 are formed for contacts 32 that are also filled with metal when layer 26 is deposited.

Although a polysilicon gate having five fingers is shown in the figures, it will be appreciated that any number of fingers (and source and drain regions) may be formed.

Figure 2:
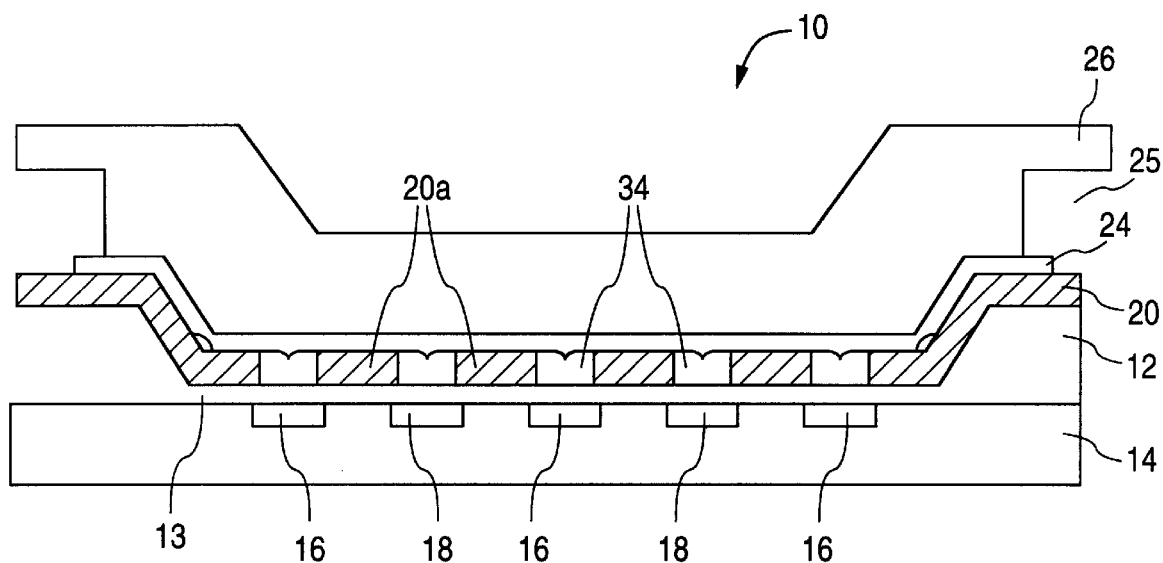
FIG. 2 is a cross sectional view (along line A—A of FIG. 3) of an exemplary MOS transistor having multiple fingers according to the present invention.
Figure 3:
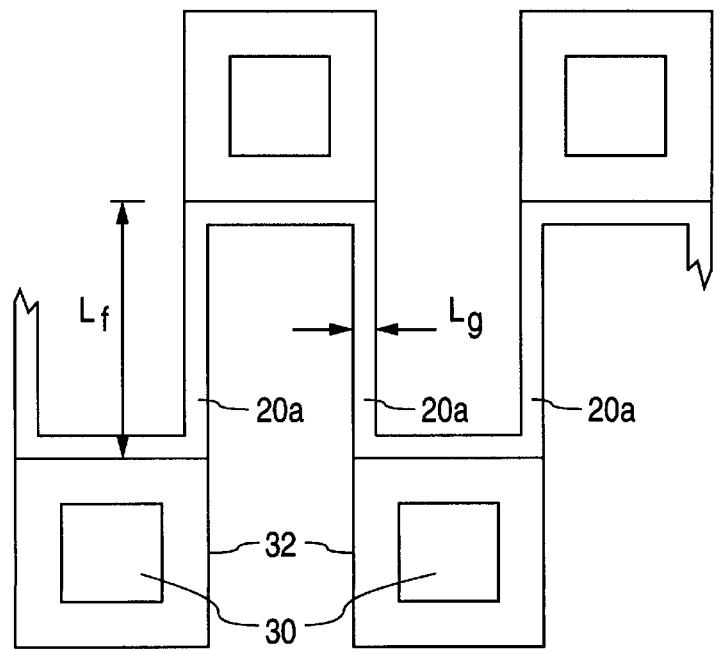
FIG. 3 is a partial plan view of an exemplary MOS transistor having multiple fingers in which the fingers are configured in a serpentine pattern according to the present invention.

As shown in FIGS. 2 and 3, gate 20 has multiple fingers 20a arranged between contact windows 32 in a serpentine pattern Fingers 20a are separated from each other by portions 34 of insulating layer 22. The total gate width is then $L_f n$, where $L_f$ is the length of each finger 20a and n is the number of fingers. The gate resistance $R_g$ is that of metal layer 26 that is deposited. It is preferred that the spaces between the fingers 20a are fully filled by deposited oxide 22 (i.e., oxide-filled spaces 34) and that oxide-filled spaces 34 are planarized and level with the polysilicon fingers 20a. This arrangement may be achieved by depositing polysilicon layer 20 of thickness k, having fingers (also of thickness k) separated by a space equal to 2 k, and depositing an oxide layer 22 of thickness k on top of the polysilicon layer and filling the spaces completely with oxide. A typical value for k is $0.3\mu$. A typical value of W is $20\mu$ and a typical value of $L_g$ is $0.35\mu$.

Gate-to-source capacitance and gate-to-drain capacitance are reduced as a result of forming the source and drain regions without tilting the substrate during ion implantation and using chemical mechanical polishing (CMP), rather than other planarization techniques, to minimize thermal effects that promote lateral diffusion of dopant atoms underneath the gate.

MOS transistors of the present invention are suitable for operation at high frequencies because $f_{max}$ and $f_t$ increase as gate resistance and gate-to-source and gate-to-drain capacitances are reduced.

Methods according to the present invention are now described with reference to FIGS. 4a–g and FIGS. 5a–e. Generally, the MOS transistors according to the present invention are built by aligning a series of masks for patterning each level of the device in the desired way to achieve the structures exemplified in the figures and described above.

Figure 5E:
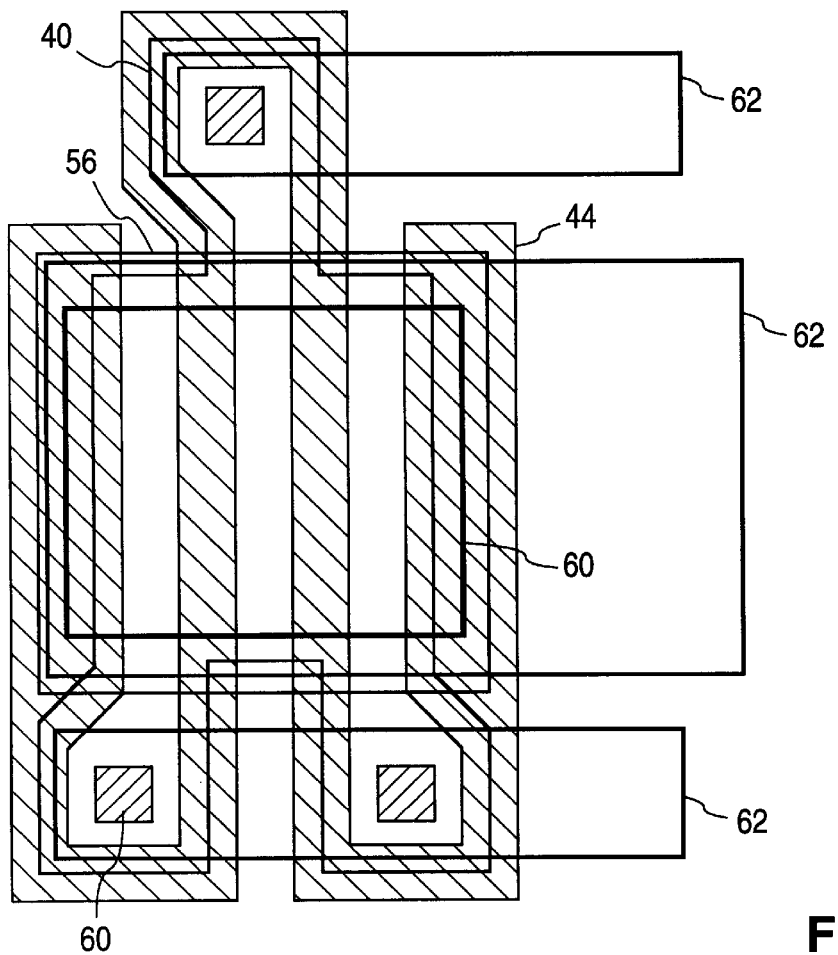
FIGS. 5a–e are plan views of masks used to layout structures in the MOS transistors according to the present invention.
Figure 4A:
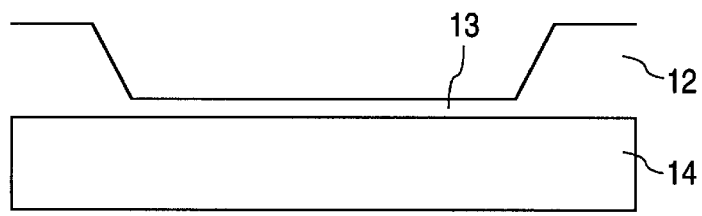
FIGS. 4a–g are cross sectional views of the MOS transistor structure at different stages in fabrication methods according to the present invention.
Figure 5A:
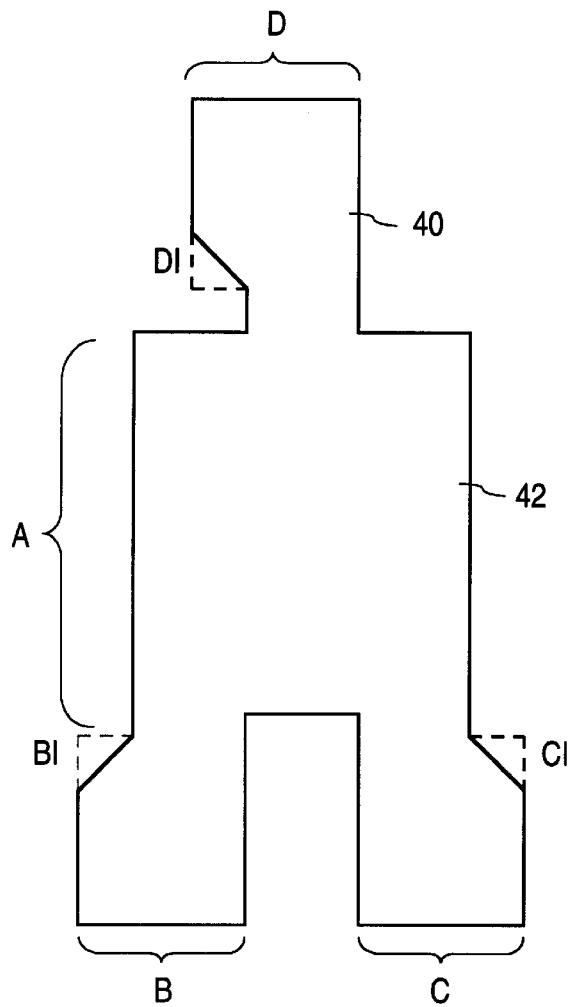
Figure 5B:
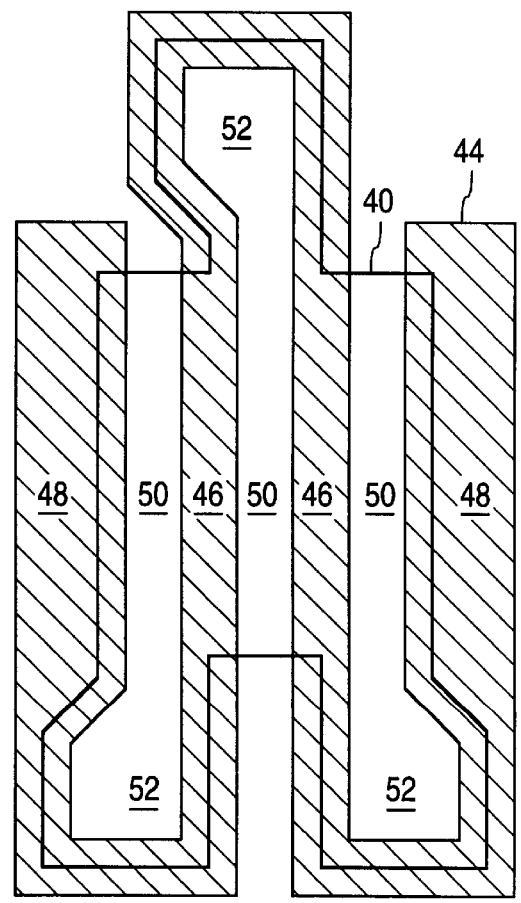

Composite mask 40, shown in FIG. 5a, defines the active device area 42 surrounded by conventional field oxide regions 12. FIG. 4a shows a thin gate oxide layer 13 formed on the substrate 14. Field oxide regions 12 surround thin oxide layer 13 and active device region 42.

As shown in FIG. 5a, composite mask 40 may generally be described as a square A with three smaller polygons B, C, and D attached to opposing sides. Triangular regions B1, C1, and D1 if added to polygons B, C and D would form squares. The significance of this design will be explained in greater detail below.

Figure 4B:
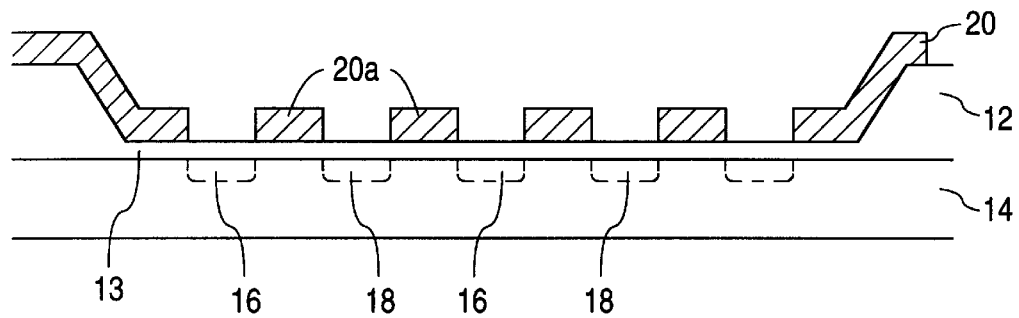

Next, a polysilicon layer 20 is formed by conventional techniques over thin oxide layer 13 and field oxide regions 12 (FIG. 4b). For a multifinger gate, the gate area is further defined by a poly mask 44 (FIG. 5b) utilized to etch the polysilicon layer 20 to form polysilicon fingers 20a.

The configuration and alignment of poly mask 44 with respect to composite mask 40 is such that a polysilicon gate structure 20 having fingers 20a in a serpentine pattern is formed in the active device region 42. More particularly, poly mask 44 defines four regions 46, 48, 50 and 52. Regions 46 define the areas in which fingers 20a are formed from the polysilicon layer. Regions 48 define where the polysilicon is etched down to field oxide regions 12. Regions 50 define the spaces created from polysilicon etched to the surface of the gate oxide layer 13 between fingers 20a and eventually filled to form oxide-filled spaces 34. Regions 52 define the areas at the ends of the fingers from which polysilicon is etched to open contact windows 30. Generally, regions 52 are similarly shaped to, but smaller than, polygonal regions B, C and D.

After the polysilicon layer is etched, the photoresist is not stripped, but rather used as a mask for ion implantation to form the source and drain regions 16, 18 of the MOS device. To reduce capacitance due to gate-to-source and gate-to-drain overlaps, the substrate is not tilted during implantation. Typical conditions for arsenic ion implantation are: 5E15 ion implantation dosage and implantation energy of 30–50 keV. The resistivity of the source and drain regions is typically about $30\Omega/sq$.

The photoresist is then stripped and the polysilicon is oxidized under conventional conditions to form a thin ($\approx$50–100 Å) oxide layer on the fingers (not shown).

Figure 4C:
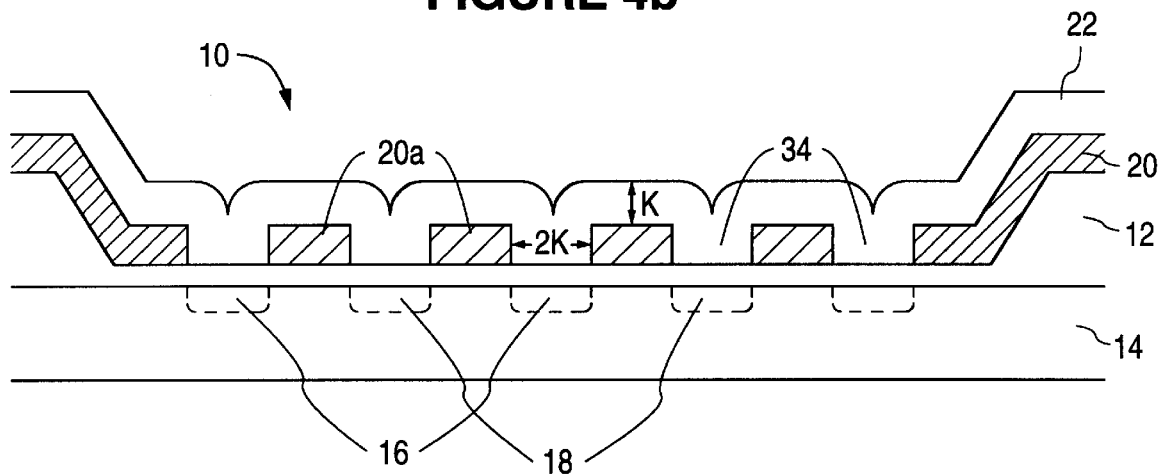
Figure 4E:
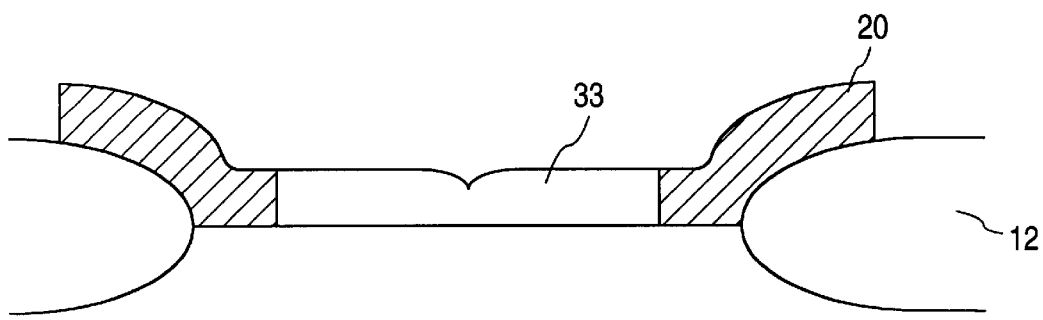
Figure 4D:
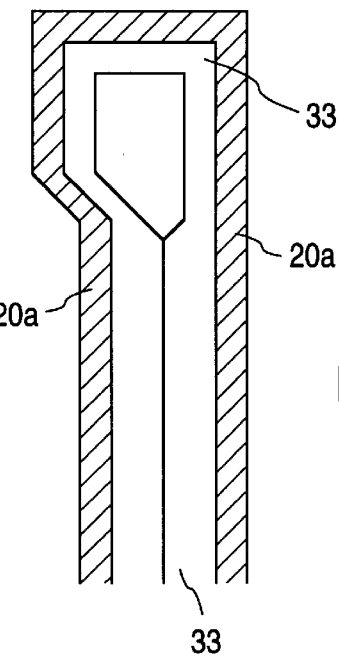

In the next step, as illustrated in FIG. 4c, a conformal oxide layer 22 is deposited, filling in the spaces between the fingers 20a, forming oxide-filled spaces 34 as well as covering the fingers 20a and field oxide regions 12. Because regions 52 are wider than regions 50, regions 52 are not completely filled with oxide in this step. Because it is desired to deposit an oxide film of constant thickness, oxide 33 fills region 50, but forms along the periphery of the polysilicon layer in regions 52, i.e., does not completely fill regions 52, as shown in FIGS. 4d and 4e.

Typically, conformal oxide layer 22 is deposited by conventional chemical vapor deposition techniques such as LPCVD using tetraethylorthosilicate (TEOS) or APCVD using TEOS, ozone and silicon dioxide. In order that the spaces between the fingers are fully filled by the deposited oxide, the thickness of both the fingers and the deposited oxide is k and the spacing is $\leq 2k$, where k is typically $0.3\mu$.

Figure 4F:
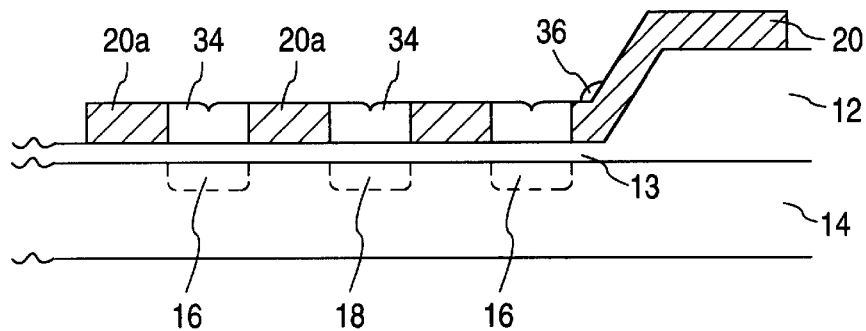

The conformal oxide layer 22 is then masked and anisotropically etched with endpoint detection on the polysilicon, resulting in a planarized profile, as shown in the exploded partial view of the device in FIG. 4f. A small amount of oxide 36 may remain adjacent to the edge of polysilicon layer 20. Oxide deposited in regions 52 remains along the edge of the polysilicon layer 20 and in regions 50 oxide remains along the edges of fingers 20a.

Figure 4G:
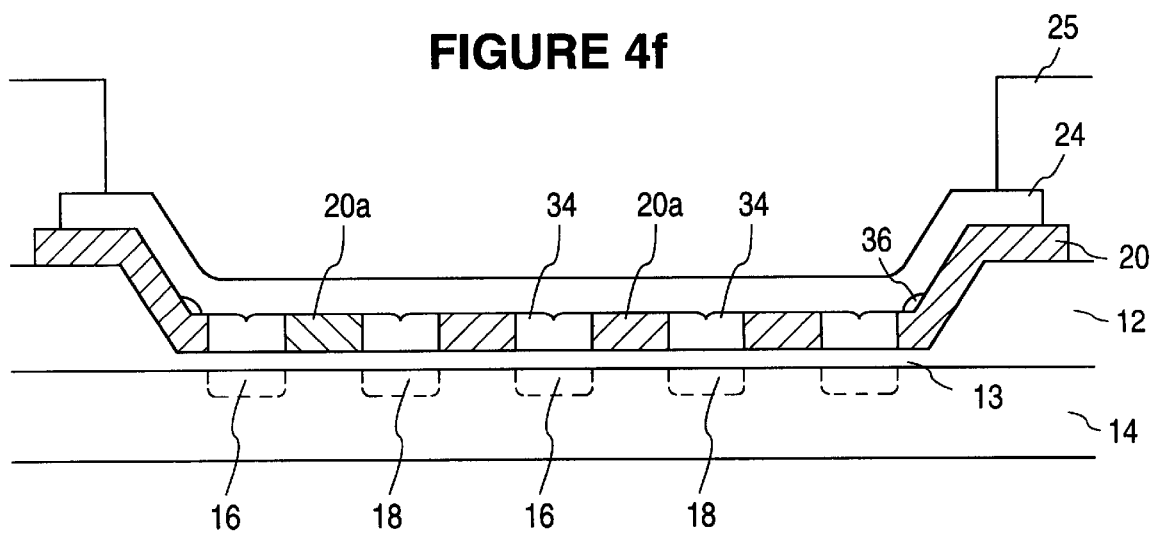
Figure 5C:
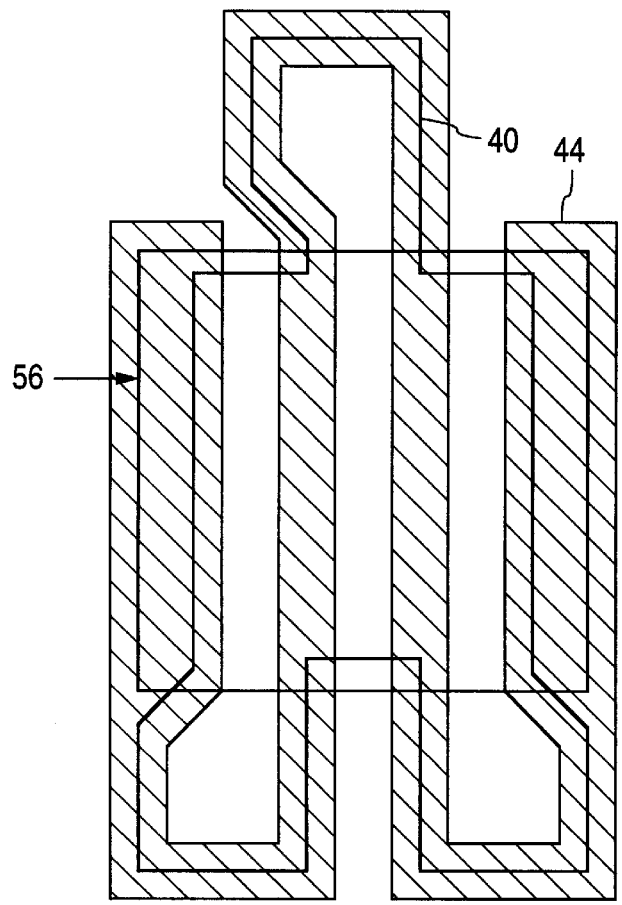
Figure 5D:
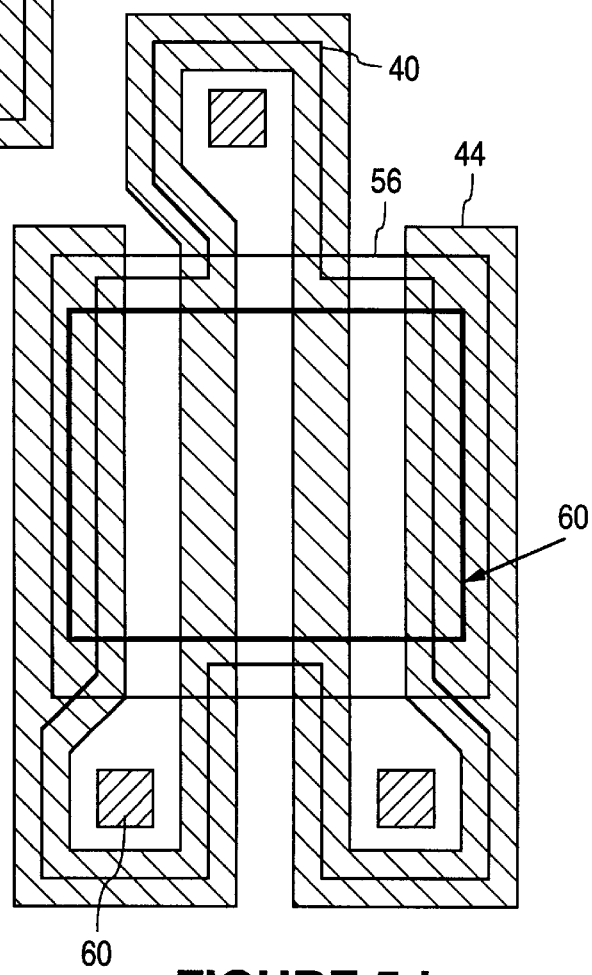

FIG. 4g shows thin metal layer 24 deposited over the polysilicon fingers 20a and planarized oxide-filled spaces 34. The thin (≈500 Å) metal layer 24 may be either a refractory metal silicide such as $WSi_2$, $TaSi_2$, $TiSi_2$ and $MoSi_2$, or in situ doped polysilicon. Metal layer 24 is patterned using a rectangular mask 56 aligned with masks 40 and 44 as shown in FIG. 5c. After etching, metal layer 24 covers the active device region extending out to the field oxide regions, but does not cover any contact windows.

In the next step, a conventional interlevel dielectric 25, such as silicon dioxide, is deposited, planarized by chemical mechanical polishing (CMP) and etched (FIG. 4g) using mask 60 (FIG. 5d) such that the interlevel dielectric 25 overlying metal layer 24 is substantially removed from the active device region. Contacts to source and drain regions are opened as well.

Aluminum metal is then deposited to form an interconnect with underlying metal layer 24. An exemplary aluminum thickness is between about 0.5μ and about 1μ; suitable thicknesses are those by which total gate shorting is achieved by the aluminum/polysilicon stack. The area in which the interconnect is formed is defined by mask 62, aligned as shown in FIG. 5e. Unnecessary areas of aluminum are etched away, leaving aluminum layer 26 overlying metal layer 24 to form the metal interconnect over the active device area. In the MOS structure shown in FIG. 2, metal layer 24 and metal layer 26 form a stack that shorts the entire gate, including all of the fingers, at the same time.

While the present invention is disclosed by reference to the preferred embodiments and examples detailed above, it is to be understood that these examples are intended in an illustrative rather than limiting sense, as it is contemplated that many modifications within the scope and spirit of the invention will readily occur to those skilled in the art and the appended claims are intended to cover such variations.

I claim:

1. A MOS transistor, comprising:

a plurality of polysilicon gate regions;

an interconnect comprising a first metal layer and a second metal layer, said first metal layer overlying and individually contacting each one of said plurality of polysilicon gate regions and said second metal layer overlying and contacting said first metal layer and forming a stack with said first metal layer to completely short together all of said plurality of polysilicon gate regions.

2. A MOS transistor according to claim 1, wherein said first metal comprises a refractory metal silicide or a doped polysilicon.

3. A MOS transistor according to claim 1, wherein said second metal comprises aluminum.

4. A MOS transistor according to claim 3, wherein said aluminum layer is between about 0.5 μm and 1 μm thick.

5. A MOS transistor according to claim 1, wherein said plurality of polysilicon gate regions has a plurality of fingers in a serpentine pattern and the fingers are separated by oxide-filled spaces.

6. A MOS transistor according to claim 5, wherein said fingers have a thickness k and said oxide-filled spaces have a width of ≦2k and are formed from a conformal oxide layer having a thickness of k.

7. A MOS transistor fabricated according to a method comprising the steps of:

a) defining a plurality of polysilicon gate regions;

b) depositing a conformal oxide over each one of said plurality of polysilicon gate regions;

c) anisotropically etching the conformal oxide with endpoint detection on each one of said plurality of polysilicon gate regions;

d) forming a refractory metal silicide or doped polysilicon layer over and in individual contact with each one of said plurality of polysilicon gate regions; and e) depositing aluminum over and in contact with the refractory metal silicide or doped polysilicon layer to form a stack that completely shorts together all of said plurality of polysilicon gate regions.

8. A MOS transistor fabricated according to a method comprising the steps of:

a) forming a field oxide on a semiconductor wafer using a first mask to define a plurality of gate areas in an active device area on a substrate;

b) patterning and etching a polysilicon layer through a second mask to form a plurality of polysilicon gate terminals of thickness k which together form a plurality of polysilicon fingers joined in a serpentine pattern and separated by spaces ≦2 k, wherein said second mask defines first, second, third and fourth regions, said first region defining where said fingers are formed from said polysilicon layer, said second region defining where said polysilicon is etched, but field oxide remains, said third region defining where said polysilicon is etched between said fingers to form said spaces, and said fourth region defining where said polysilicon is etched to open contact windows;

c) stripping the photoresist remaining from step b);

d) oxidizing the polysilicon to form oxide on said fingers;

e) depositing a conformal oxide over said oxide on said fingers, in said spaces and in said fourth regions for contact windows;

f) anisotropically etching said oxides formed in steps d) and e) with endpoint detection on said polysilicon;

g) etching a metal layer of refractory metal silicide or doped polysilicon deposited on and in individual contact with said fingers and said oxide-filled spaces using a third mask so that the metal layer covers said active device area but does not cover said fourth regions;

h) contact mask printing and etching said dielectric layer using a fourth mask to expose said metal layer and to open contacts; and i) etching an aluminum layer to form an interconnect with said metal layer using a fifth mask, said interconnect shorting together all of said plurality of polysilicon fingers at the same time.

* * * * *